United States Patent [19]
Kimura

[11] Patent Number: 5,872,483
[45] Date of Patent: *Feb. 16, 1999

[54] HYPERBOLIC SINE AND COSINE FUNCTIONAL CIRCUITS, SQUARING CIRCUIT, AND OTA CONSISTING OF TWO DIFFERENTIAL CIRCUITS WITH A DYNAMIC BIAS CURRENT

[75] Inventor: Katsuji Kimura, Tokyo, Japan

[73] Assignee: NEC Corporation, Tokyo, Japan

[ * ] Notice: The term of this patent shall not extend beyond the expiration date of Pat. No. 5,485,119.

[21] Appl. No.: 669,855

[22] Filed: Jun. 26, 1996

Related U.S. Application Data

[60] Continuation of Ser. No. 465,469, Jun. 5, 1995, abandoned, which is a division of Ser. No. 357,252, Dec. 13, 1994.

[30]     Foreign Application Priority Data

Dec. 13, 1993  [JP]  Japan ................................. 5-311990
Dec. 28, 1993  [JP]  Japan ................................. 5-338605

[51] Int. Cl.$^6$ ................................................. G06G 7/26
[52] U.S. Cl. ........................... 327/563; 327/66; 327/361; 327/363; 327/538; 330/252; 330/261
[58] Field of Search ................................. 327/560, 561, 327/562, 563, 356, 359, 361, 363, 538, 65–67; 330/250, 251, 252, 253

[56]            References Cited

U.S. PATENT DOCUMENTS

| | | | |
|---|---|---|---|
| 4,109,214 | 8/1978 | Main ............................................ | 330/254 |
| 5,151,625 | 9/1992 | Zarabadi et al. .......................... | 327/356 |
| 5,184,086 | 2/1993 | Inohana et al. ........................... | 330/252 |
| 5,355,094 | 10/1994 | Soda .......................................... | 330/260 |
| 5,365,191 | 11/1994 | Hayashi ..................................... | 330/252 |
| 5,373,741 | 12/1994 | Volkman et al. ......................... | 330/252 |
| 5,438,296 | 8/1995 | Kimura ...................................... | 327/560 |
| 5,448,196 | 9/1995 | Kanbara et al. ........................... | 327/563 |
| 5,475,323 | 12/1995 | Harris et al. .............................. | 327/67 |
| 5,481,224 | 1/1996 | Kimura ...................................... | 330/253 |
| 5,485,119 | 1/1996 | Kimura ...................................... | 327/349 |
| 5,500,623 | 3/1996 | Kimura ...................................... | 330/252 |
| 5,581,211 | 12/1996 | Kimura ...................................... | 327/356 |

OTHER PUBLICATIONS

A. Nedungadi and T.R. Viswanathan, "Design of Linear CMOS Transconductance Elements", *IEEE Transactions on Circuits and Systems*, vol. CAS–31, No. 10, Oct. 1984, pp. 891–894.

K. Kimura, "An MOS Operational Transconductance Amplifier and an MOS Four–Quadrant . . . Cell", *IEICE Trans. Fundamentals*, vol. E75–A, No. 12, Dec. 1992, pp. 1774–1776.

Francois Krummenacher and Norbert Joehl, "A 4–MHz CMOS Continuous–Time Filter . . . Automatic Tuning", *IEEE Journal of Solid–State Circuits*, vol. 23, No. 3, Jun. 1988, pp. 750–758.

(List continued on next page.)

*Primary Examiner*—Timothy P. Callahan
*Assistant Examiner*—Kenneth B. Wells
*Attorney, Agent, or Firm*—Sughrue, Mion, Zinn, Macpeak & Seas, PLLC

[57]                ABSTRACT

In a differential circuit including first and second transistors, a constant current circuit causes a constant current to flow through the first transistor. A variable current circuit causes a variable current to flow through the second transistor. A differential input voltage is given to drive the first and the second transistors and to produce an output signal in the form of an output current which may be either a differential output current across two output electrodes or a variable output current flowing through an output electrode. Each of the first and the second transistors may be bipolar transistors or MOSFET's. A relationship between the differential input voltage and the output signal is specified by a peculiar characteristic dependent on the bipolar transistors or the MOSFET's. Therefore, the differential circuit may be incorporated in an LSI circuit.

11 Claims, 12 Drawing Sheets

OTHER PUBLICATIONS

Zhenhua Wang and Walter Guggenbühl, "A Voltage–Controllable Linear MOS Transconductor Using Bias Offset Technique", *IEEE Journal of Solid–State Circuits*, vol. 25, No. 1, Feb. 1990, pp. 315–317.

M.F. Li, X. Chen and Y.C. Lim, "Linearity Improvement of CMOS Transconductors for Low Supply Applications", *Electronics Letters*, vol. 29, No. 12, Jun. 10, 1993, pp. 1106–1107.

Dupuie and Ismail, "High Frequency CMOS Transconductors", Peter Perengrinus Ltd., publisher, London, pp. 204–209, 1990.

HYPERBOLIC SINE AND COSINE FUNCTIONAL CIRCUITS, SQUARING CIRCUIT, AND OTA CONSISTING OF TWO DIFFERENTIAL CIRCUITS WITH A DYNAMIC BIAS CURRENT

This is a Continuation of application Ser. No. 465,469 filed Jun. 5, 1995, now abandoned, which is a Divisional application of Ser. No. 08/357,252 filed Dec. 13, 1994.

BACKGROUND OF THE INVENTION

This invention relates to a differential circuit for use in obtaining a desirable characteristic.

Heretofore, a wide variety of differential circuits have been proposed so as to accomplish desired characteristics. Herein, such differential circuits are largely classified into a first type of differential circuits formed by bipolar transistors and a second type of differential circuits formed by MOSFET's (Metal Oxide Semiconductor Field Effect Transistors).

A conventional first type of such differential circuits comprises first and second bipolar transistors which have first and second bases, first and second collectors, and first and second emitters, respectively. Both of the first and the second emitters are connected to a constant current circuit in common. With this structure, a differential input voltage is given across the first and the second bases while an output signal is produced in the form of a collector current at either one of the first and the second collectors or between the first and the second collectors.

Herein, it is known that the output signal, namely, the collector current is approximately varied in relation to the differential input voltage in accordance with an exponential law. In addition, it often happens that a hyperbolic sine, cosine, or tangent curve characteristic is required between the differential input voltage and the output signal in order to carry out various kinds of signal conversions. The characteristics between the differential input voltage and the collector current are known as transfer characteristics.

However, the conventional differential circuit of the first type can achieve neither a correct exponential characteristic nor correct hyperbolic sine, cosine, or tangent curve characteristics. This means that an exponential function, a hyperbolic function, a hyperbolic sine function, and a hyperbolic cosine function can not be realized by the use of the differential circuit of the first type, in spite of the fact that such functions are very important for conversions of the signals. Under the circumstances, realization of such various functions is preferable for the signal conversions. Especially, if such functions can be obtained by the use of a differential circuit manufactured by a semiconductor integrated circuit technique, the differential circuit in question can be directly connected to other circuits within a semiconductor chip and can be integrated with the other circuits.

On the other hand, various kinds of second-type differential circuits have been also conventionally proposed which comprise a pair of MOSFETs having sources connected in common to each other. Such a second-type differential circuit is used as a squaring circuit or an operational transconductance amplifier (OTA), because a drain current is varied relative to a voltage between a source and a gate of each of MOSFETs in accordance with a square law. Thus, the second-type differential circuit exhibits a squaring characteristic.

As the differential circuit of the second type, A. Nedungadi and T. R. Viswanathan have proposed a complementary metal-oxide semiconductor (CMOS) OTA in an article entitled "Design of Linear CMOS Transconductance Elements" (IEEE TRANSACTIONS ON CIRCUITS AND SYSTEMS, Vol. CAS-31, No. 10, pp. 891–894, OCTOBER 1984).

The inventor of the present invention has also proposed a CMOS OTA in a paper described in IEICE TRANSACTIONS ON FUNDAMENTALS, Vol. E75-A, No. 12, pp. 1774–1776, DECEMBER 1992 and entitled "An MOS Operational Transconductance Amplifier and an MOS Four-Quadrant Analog Multiplier Using the Quadritail Cell".

Furthermore, François Krummenacher and Norbert Joehl have proposed a differential circuit in an article described in IEEE JOURNAL OF SOLID-STATE CIRCUITS, Vol. 23, No. 3, pp. 750–758, JUNE 1988 and entitled "A 4-MHz CMOS Continuous-Time Filter with On-Chip Automatic Tuning".

Moreover, Zhenhua Wang and Walter Guggenbühl have proposed an OTA in a paper entitled "A Voltage-Controllable Linear MOS Transconductor Using Bias Offset Technique" (ZHENHUA WANG and WALTER GUGGENBÜHL, IEEE JOURNAL OF SOLID-STATE CIRCUITS, Vol. 25, No. 1, pp. 315–317, FEBRUARY 1990).

In addition, M. F. Li, X. Chen and Y. C. Lim proposed a differential circuit in an article entitled "LINEARITY IMPROVEMENT OF CMOS TRANSCONDUCTORS FOR LOW SUPPLY APPLICATIONS" (ELECTRONICS LETTERS, 10th Jun. 1993, Vol. 29, No. 12, pp. 1106–1107).

At any rate, each of the differential circuits utilizes a squaring characteristic of the MOSFETs. Practically, the squaring circuit or the OTA can be readily structured by the use of a root characteristic of the MOSFET's, as mentioned in a book published by Peter Peregrinus Ltd in London and entitled "High Frequency CMOS Transconductors" (written by Dupuie and Ismail and edited by Toumazou, Lidgey, and Haigh in Analog IC design).

However, the squaring characteristic is determined by a threshold voltage of each of MOSFETs that can not electrically be changed by an external circuit. This shows that the squaring characteristic can not be controlled by a program or the like. Therefore, it is difficult to incorporate the differential circuit of the second type into an integrated circuit together with any other circuit elements.

SUMMARY OF THE INVENTION

It is therefore an object of this invention to provide a differential circuit which can correctly achieve various kinds of desired characteristics and which may be structured either by bipolar transistors or MOSFET's.

It is a specific object of this invention to provide a differential circuit of the type described, which can achieve a hyperbolic characteristic, such as a hyperbolic sine characteristic, a hyperbolic cosine characteristic, and the like.

It is another object of this invention to provide a differential circuit of the type described, which can correctly achieve a squaring characteristic.

It is still another object of this invention to provide a differential circuit of the type described, which can readily be formed as an integrated circuit.

Other objects of this invention will become clear as the description proceeds.

According to this invention, a differential circuit is supplied with a differential input voltage to produce an output signal in response to the differential input voltage.

According to the above-mentioned aspect of this invention, the differential circuit comprises first and second bipolar transistors which have first and second bases, first and second collectors, and first and second emitters connected to each other, respectively. The first and the second bases are supplied with the differential input voltage. A constant current circuit is connected to the first emitter for causing a constant current to flow from the first collector to the first emitter. A variable current circuit is connected to the second emitter for causing the output signal to flow from the second collector to the second emitter in response to the differential input voltage.

DESCRIPTION OF THE PREFERRED EMBODIMENT

Figure 1:
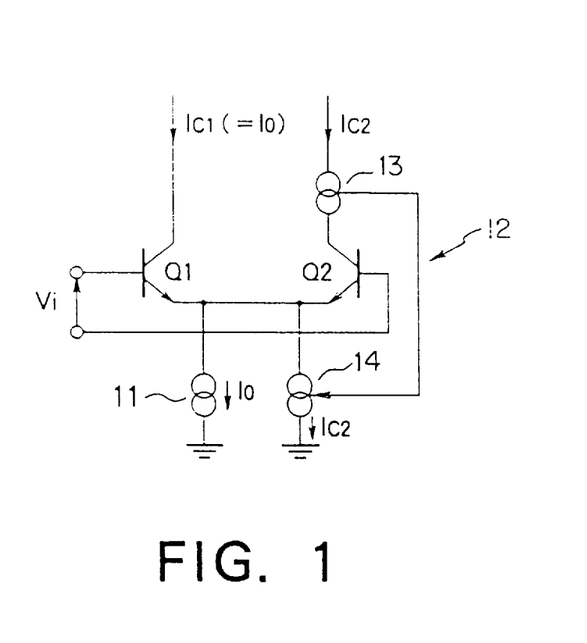
FIG. 1 is a circuit diagram of a differential circuit according to a first embodiment of this invention.
Figure 2:
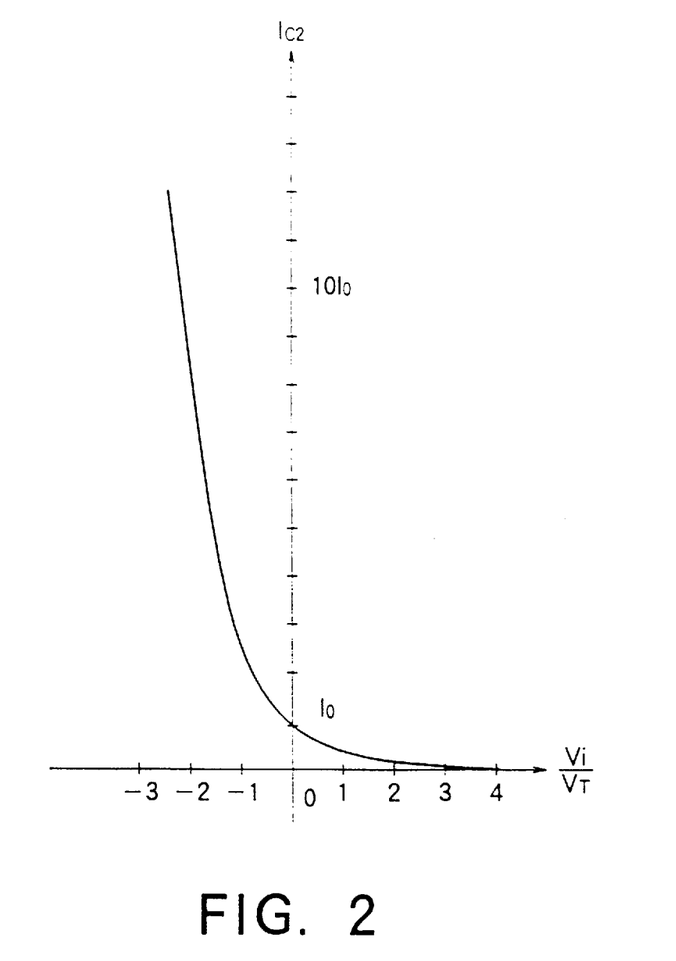
FIG. 2 shows a transfer characteristic between an input voltage and a collector current in the differential circuit illustrated in FIG. 1.

Referring to FIGS. 1 and 2, the following is a description of a differential circuit according to a first embodiment of this invention. The differential circuit comprises first and second bipolar transistors Q1 and Q2 which have first and second bases, first and second collectors, and first and second emitters connected to each other, (i.e., the first and second emitters are connected at a node). A pair of the first and the second bipolar transistors will be often called a differential pair. A constant current circuit 11 is connected to the first emitter (i.e., the node) while a variable current circuit 12 is connected to both the second emitter (i.e., the node) and is also connected to the second collector, as illustrated in FIG. 1.

With this structure, the first and the second bases are supplied with a differential input voltage Vi. In this case, the constant current circuit 11 causes a constant current I0 as a first collector current IC1 to flow from the first collector to the first emitter while the variable current circuit 12 causes a second current IC2 to flow from the second collector to the second emitter in response to the differential input voltage Vi. The first collector current IC1 is kept constant without depending on the differential input voltage Vi and is equal to the constant current Io, as depicted in FIG. 1. On the other hand, the second transistor Q2 is driven by the second current IC2 which is given by the variable current circuit 12 and which is equal to a second collector current IC2 flowing through the second collector.

Herein, it is assumed that a relationship between a collector current ICi of a bipolar transistor i and a voltage VBEi between a base and an emitter is varied in accordance with an exponential law. Under the above assumption, the collector current ICi of the bipolar transistor i is generally given by:

$$ICi = IS*\{exp(VBEi/VT)-1\}, \qquad (1)$$

where IS is representative of a saturation current, and VT, the thermal voltage given by (kT/q), where in turn k represents Boltzmann's constant; T, absolute temperature; and q, the charge of an electron.

If the VEBi between the base and the emitter is about 600 mV, the exponential term of Equation (1) is as large as an order of e to the tenth power or so. In this case, "−1" of Equation (1) can be neglected from Equation (1). Therefore, Equation (1) is rewritten into:

$$ICi = IS*\{exp(VBEi/VT)\}. \qquad (1)'$$

Then, if the first and the second bipolar transistors Q1 and Q2 are matched with each other in characteristic and the differential circuit is driven by a tail current IEE, a differential output current ΔIC is given by:

$$\Delta IC = \alpha F * IEE * \tan h(Vi/2VT), \qquad (2)$$

where αF is representative of the dc common-base current gain factor of the transistor. Usually, the dc common-base current gain factor falls between 0.98 and 0.99 and may be therefore considered to be approximately equal to unity. Under the circumstances, Equation (2) is rewritten into:

$$\Delta IC = IEE * \tan h(Vi/2VT). \qquad (2)'$$

On the other hand, the differential output current ΔIC and the tail current IEE are given by:

$$\Delta IC = IC1 - IC2 = I0 - IC2, \qquad (3)$$

and $$IEE = I0 + IC2, \qquad (4)$$

respectively.

When Equations (3) and (4) are substituted for Equation (2)', the second collector current is given by:

$$IC2 = I0 * \exp(-Vi/VT). \qquad (5)$$

When Equation (5) is compared with Equation (1), it will be noticed that the constant current I0 and the differential input voltage Vi of Equation (5) are substituted for the saturation current IS and the voltage VBEi of Equation (1)', respectively, and can be electrically controlled by an external circuit or a program, although the latter factors, such as the saturation current IS, can not be controlled.

Therefore, the second collector current IC2 can be accurately varied along an exponential curve by changing the differential input voltage Vi. In fact, the transfer characteristic of the illustrated differential circuit is varied in accordance with the exponential curve, as shown in FIG. 2. Moreover, the constant current I0 can be voluntarily or optionally varied also like the differential input voltage Vi. This shows that the exponential characteristic of the differential circuit illustrated in FIG. 1 can be also changed by varying the constant current I0.

Figure 11:
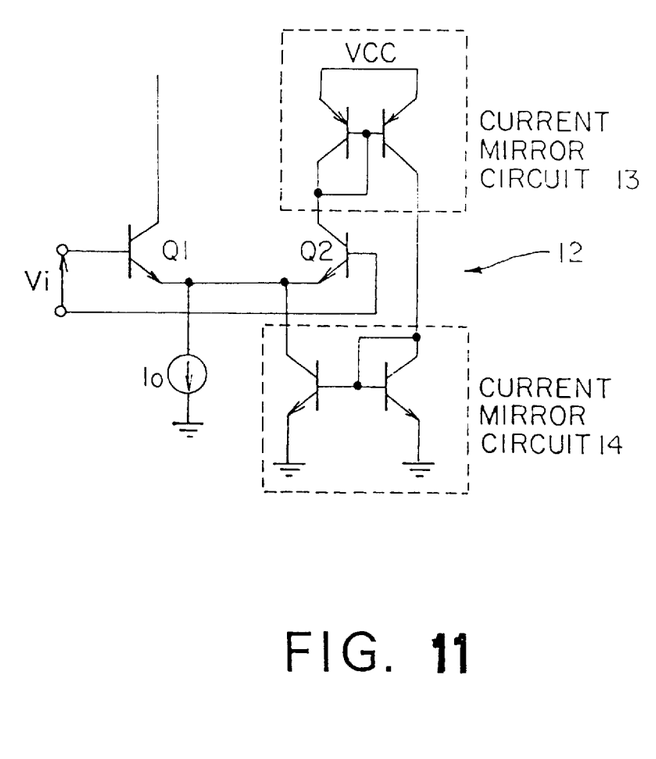
FIG. 11 illustrates the current bootstrapping loop of FIG. 1 in greater detail.

Since the differential circuit dynamically changes a bias current by the use of the variable current circuit 12, such a technique may be called a dynamic bias current technique. See M. F. Li, X. Chen and Y. C. Lim, "Linearity Improvement of CMOS Transconductors for Low Supply Applications", Electronics Letters, Vol. 29, No. 12, Jun. 10, 1993, pp. 1106–1107. In practice, the dynamic bias current technique can be realized by a current bootstrapping loop which can be implemented by a known combination of two current mirror circuits. FIG. 11 illustrates in more detail the current bootstrapping loop of FIG. 1. Specifically, each of current mirror circuits 13 and 14 comprises two bipolar transistors connected as shown.

Figure 3:
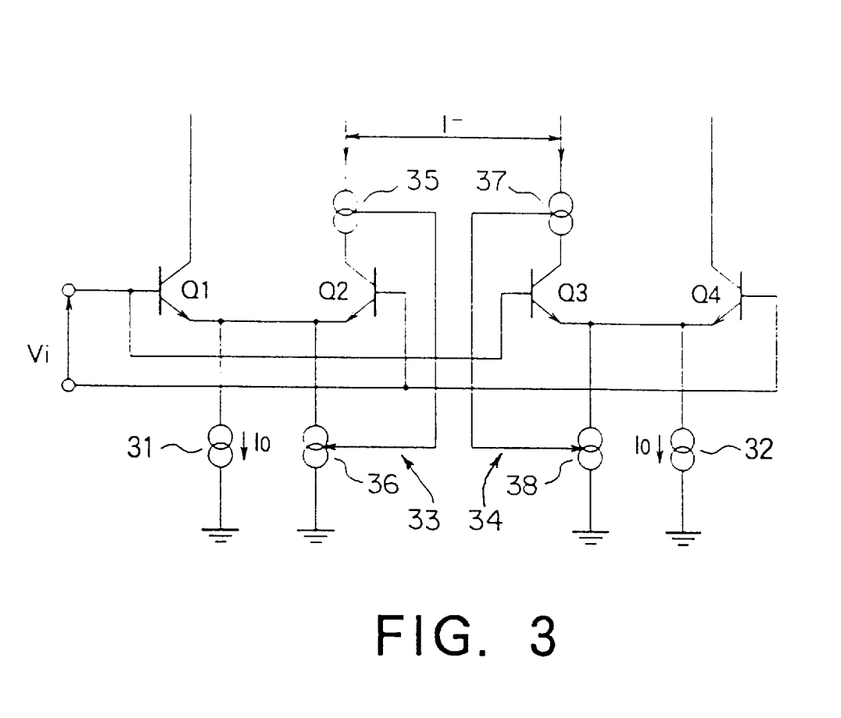
FIG. 3 is a circuit diagram of a differential circuit according to a second embodiment of this invention.
Figure 4:
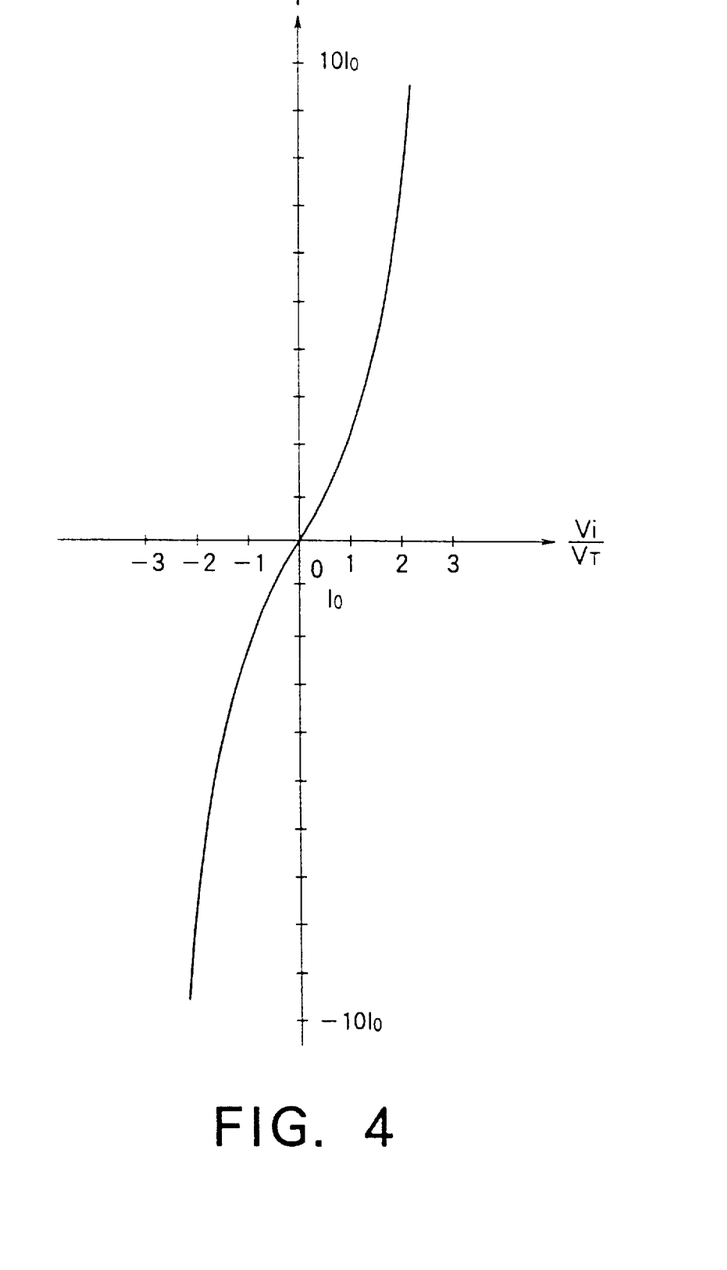
FIG. 4 shows input output characteristics of the differential circuit illustrated in FIG. 3.

Referring to FIGS. 3 and 4, description will be directed to a differential circuit according to a second embodiment of this invention. The differential circuit comprises two of differential pairs each of which is structured in the manner illustrated in FIG. 1.

The differential circuit comprises first, second, third, and fourth bipolar transistors Q1, Q2, Q3, and Q4. The first, the second, the third, and the fourth bipolar transistors Q1, Q2, Q3, and Q4 have first, second, third, and fourth collectors, first, second, third, and fourth bases, and first, second, third, and fourth emitters, respectively. The first and the second emitters are connected to each other while the third and the fourth emitters are connected to each other. The first and the third bases are connected to each other while the second and the fourth bases are connected to each other.

The first and the second bases are supplied with a differential input-voltage Vi. Likewise, the third and the fourth bases are also supplied with the differential input voltage Vi.

Furthermore, first and second constant current circuits 31 and 32 are connected to the first and the fourth emitters, respectively. The first constant current circuit 31 causes a first constant current to flow from the first collector to the first emitter. Similarly, the second constant current circuit 32 causes a second constant current to flow from the fourth collector to the fourth emitter. Each of the first and the second constant currents is equal to each other and is therefore depicted at I0 in FIG. 3.

On the other hand, a first variable current circuit 33 is connected to the second emitter and the second collector. The first variable current circuit 33 causes a first variable current to flow from the second collector to the second emitter. Similarly, a second variable current circuit 34 is connected to the third emitter and the third collector to cause a second variable current to flow from the third collector to the third emitter.

This shows that the first variable current flows through the second bipolar transistor Q2 in response to the differential input voltage Vi and that the second variable current flows through the third bipolar transistor Q3 in response to the differential input voltage Vi.

A difference current between the first and the second variable currents appears as an output signal between the second and the third collectors. Accordingly, the second and the third collectors serve to extract the difference between the first and the second variable currents and may be referred to as a difference extraction circuit. At any rate, the output signal is represented by the difference between the first and the second variable currents and is varied with a variation of the differential input voltage Vi.

Referring to FIG. 4, a relationship between the input differential voltage Vi and the output signal, namely, the difference current is represented by a curve. From FIG. 4, it is readily understood that the curve specifies a hyperbolic sine curve and that the differential circuit therefore has a transfer characteristic specified by the hyperbolic sine curve.

Figure 5:
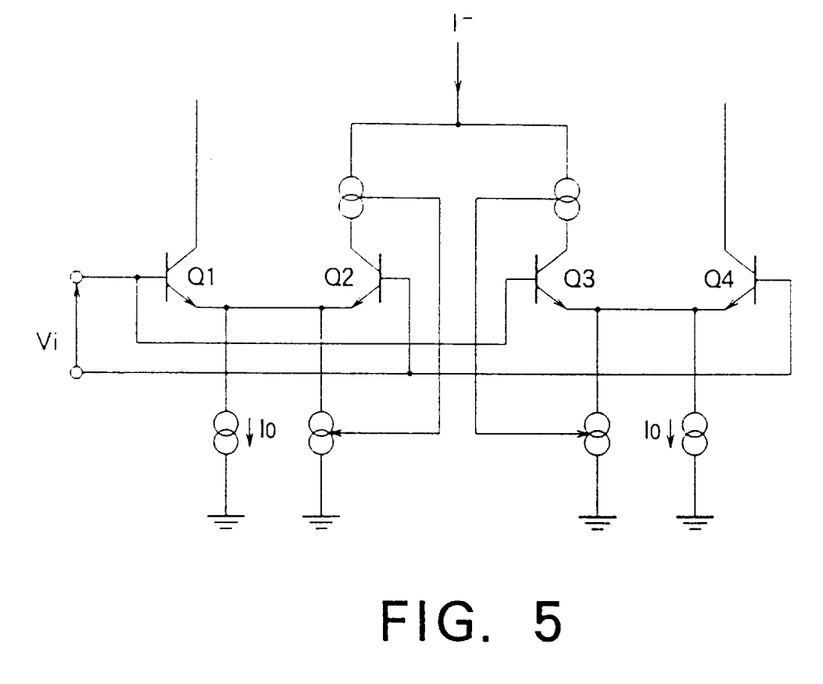
FIG. 5 is a circuit diagram of a differential circuit according to a third embodiment of this invention.
Figure 6:
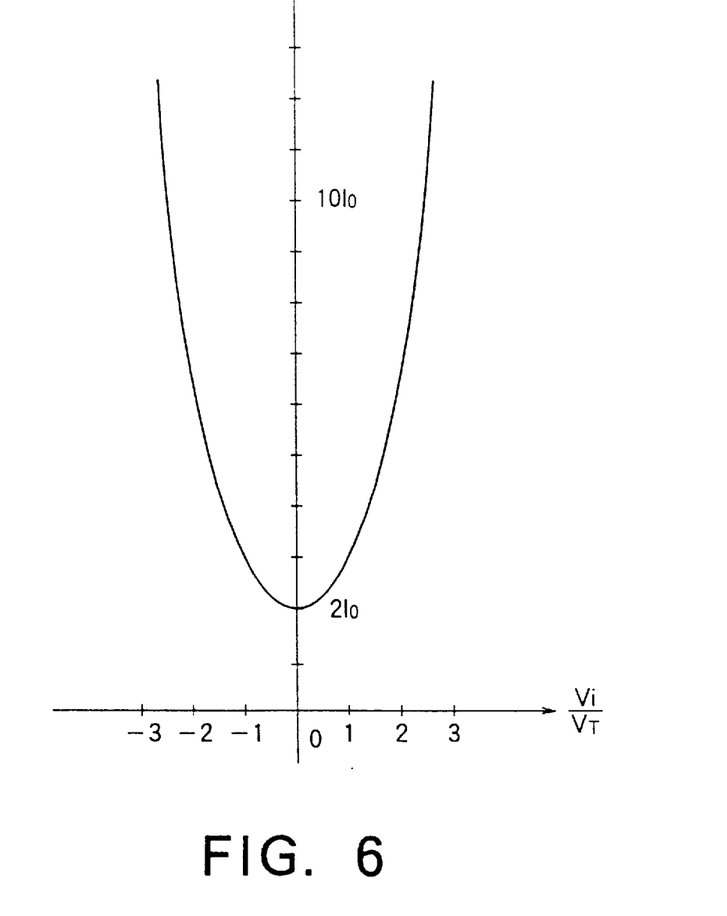
FIG. 6 shows input output characteristics of the differential circuit illustrated in FIG. 5.

Referring to FIGS. 5 and 6, description will be directed to a differential circuit according to a third embodiment of this invention.

In FIG. 5, the differential circuit is similar to the differential circuit illustrated in FIG. 3 except that the first and the second variable currents are summed up in FIG. 5 instead of the difference between the first and the second variable currents. Therefore, it may be said that the differential circuit illustrated in FIG. 5 therefore comprises a summing circuit in lieu of the difference extracting circuit of FIG. 3.

Specifically, the summing circuit is connected to the second collector and the third collector and sums up the first and the second variable currents to obtain the sum between them and to produce an output signal which is represented by the sum.

In FIG. 6, a relationship between the differential input voltage and the output signal is depicted at a curve which is specified by a hyperbolic cosine curve. Thus, the differential circuit exhibits a hyperbolic cosine transfer characteristic, as shown in FIG. 6.

Figure 7:
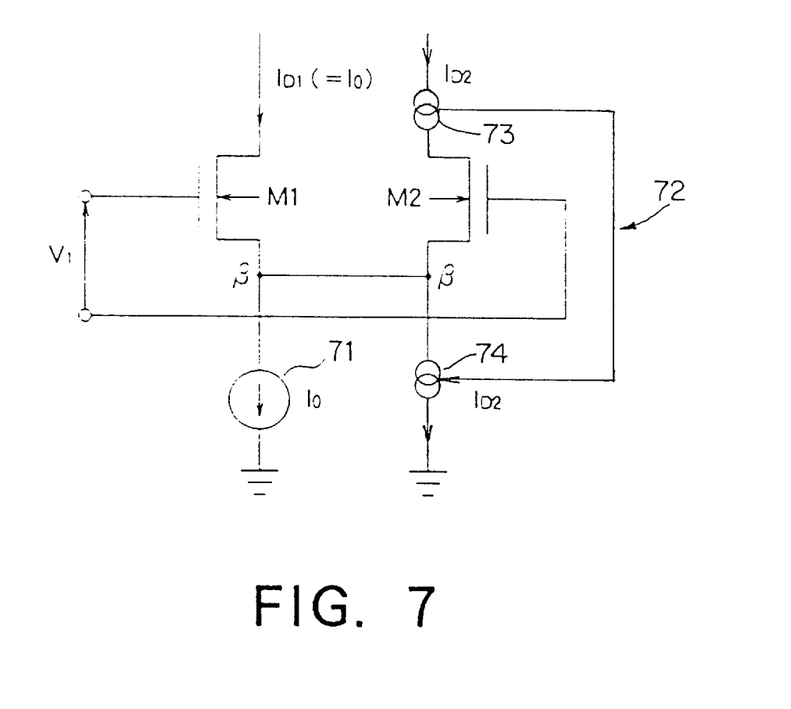
FIG. 7 is a circuit diagram of a differential circuit according to a fourth embodiment of this invention.
Figure 8:
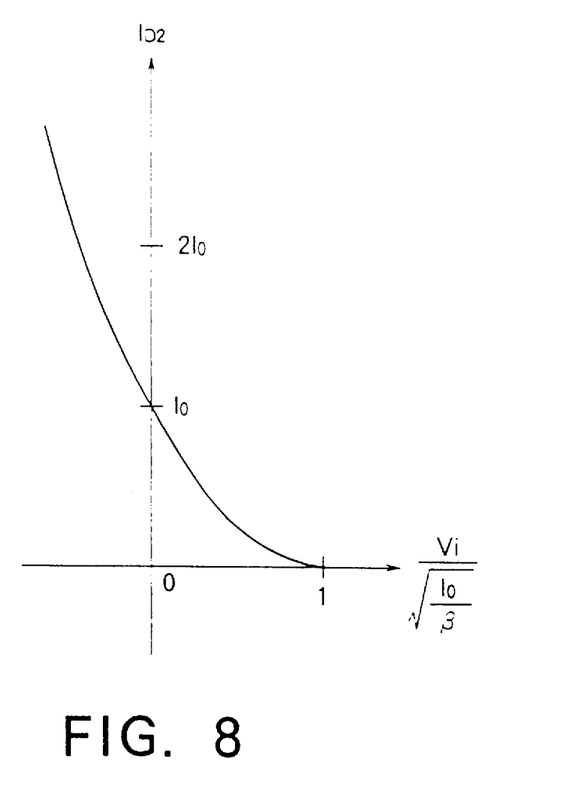
FIG. 8 shows drain current characteristics according to the differential circuit illustrated in FIG. 7.

Referring to FIGS. 7 and 8, description will proceed to a differential circuit according to a fourth embodiment of this invention. The differential circuit illustrated in FIG. 7 comprises first and second metal oxide semiconductor field effect transistors (MOSFETs) M1 and M2 which have first and second gates, first and second drains, and first and second sources, respectively. As shown in FIG. 7, the first and the second sources are connected to each other. A pair of the first and the second MOSFETs is called a differential MOS pair.

A differential input voltage Vi is given between the first and the second bases. A constant current circuit 71 is connected to the first source to cause a constant current I0 as a first drain current ID1 to flow from the first drain to the first source. The constant current I0 is kept constant independently of the differential input voltage Vi while a variable current circuit 72 is connected to the second source. The variable current circuit 72 causes a variable current as a second drain current ID2 to flow from the second drain to the second source in response to the differential input voltage Vi.

It is assumed that the first and the second MOSFETs are matched with each other in characteristic and that a relationship between a drain current and a voltage between a gate and a source in each of the MOSFETs is specified by a square law characteristic. In addition, a substrate effect is assumed to be ignored. When the differential circuit is driven by a tail current ISS, a differential output current ΔID which appears across the first and the second drains is given by:

$$\Delta ID = \beta * Vi \sqrt{\frac{2 * ISS}{\beta} - Vi^2} \quad \left(|Vi| \leq \sqrt{\frac{ISS}{\beta}}\right), \tag{6}$$

where β is representative of a transconductance parameter which is given by $\mu(Cox/2)(W/L)$, where in turn $\mu$ represents an effective surface carrier mobility; Cox, gate oxide capacitance per unit area; W, a channel width; and L, a channel length.

On the other hand, the differential circuit is formed so that the first drain current ID1 which is kept constant is caused to flow through the first MOSFET M1. Therefore, the differential output current ΔID and the tail current ISS are given by:

$$\Delta ID = ID1 - ID2 = I0 - ID2, \qquad (7)$$

and $$ISS = I0 + ID2. \qquad (8)$$

When Equations (7) and (8) are substituted into Equation (6), the second drain current is given by:

$$ID2 = \beta \left(Vi - \sqrt{(I0/\beta)}\right)^2 \qquad (Vi \leq \sqrt{(I0/\beta)}), \qquad (9)$$

$$ID2 = 0 \qquad (Vi \geq \sqrt{(I0/\beta)}).$$

By the way, in each of the MOSFETs M1 and M2, the drain current is given by:

$$ID = \beta(VGS - VTh)^2, \quad (VGS \geq VTh) \qquad (10)$$

where VGS is representative of the gate-to-source voltage, and VTh, the threshold voltage.

Since Equation (9) has to be identical with Equation (10), Vi and $\sqrt{(I0/\beta)}$ of Equation (9) can correspond to VGS and VTh, respectively.

This shows that the second drain current ID2 can be specified by the square law characteristic, as illustrated by Equation (10). Therefore, the differential circuit produces the second drain current ID2 which is varied along a square curve with a variation of the differential input voltage Vi, as shown in FIG. 8.

Moreover, the constant current I0, the differential input voltage Vi, and the transconductance parameter β can be changed by a program of an external circuit. The differential circuit can be therefore incorporated into the LSI because the characteristics of the differential circuit can be determined independently of the threshold voltage of each MOSFET's that is included in the differential circuit.

Figure 12:
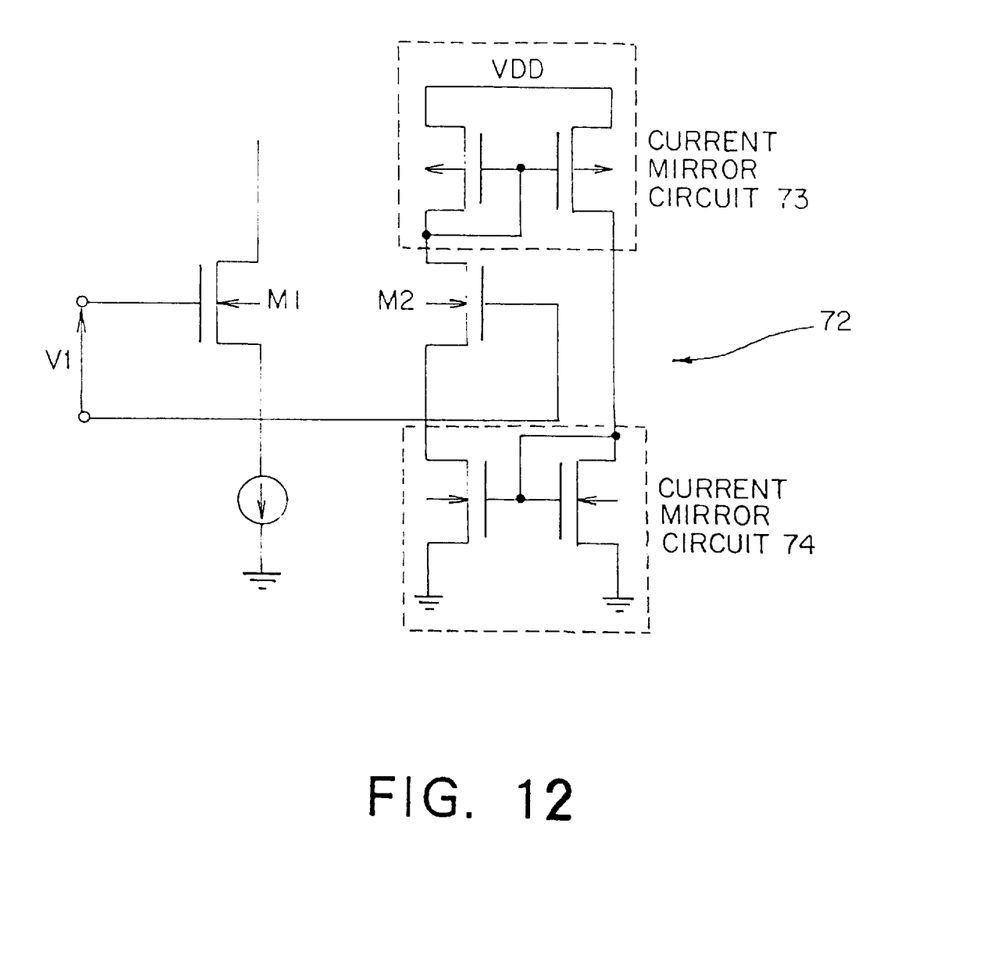
FIG. 12 illustrates the current bootstrapping loop of FIG. 7 in greater detail.

The differential circuit is realized by a dynamic bias current technique which is suggested by M. F. Li, X. Chen and Y. C. Lim in their paper "Linearity Improvement of CMOS Transconductors for Low Supply Applications", Electronics Letters, Vol. 29, No. 12, Jun. 10, 1993, pp. 1106–1107. Specifically, a current bootstrapping loop which has two current mirror circuits may be formed so as to realize such a differential circuit. FIG. 12 illustrates in more detail the current bootstrapping loop of FIG. 7. Specifically, each of current mirror circuits 73 and 74 comprises two MOSFETs connected as shown.

If two of the differential circuits are combined with each other as suggested by Dupuie and Ismail, an operational transconductance amplifier (OTA) or a squaring circuit can be realized by the two differential circuits.

Figure 9:
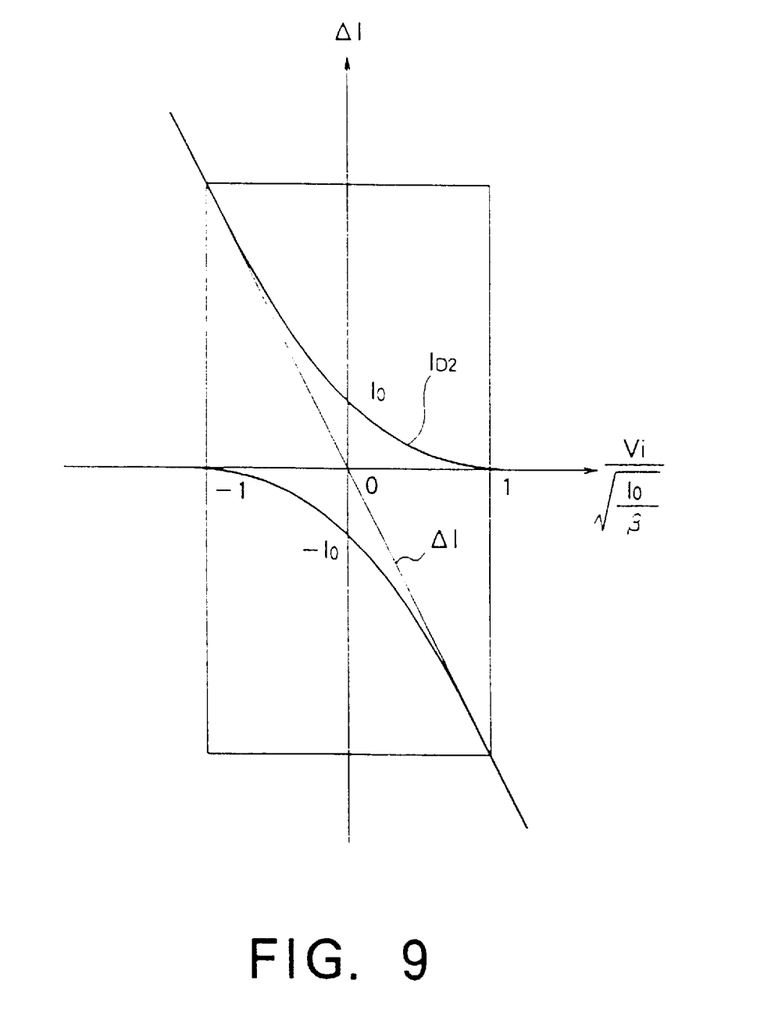
FIG. 9 shows input output characteristics of a differential circuit having a pair of the differential circuit illustrated in FIG. 7.

Practically, the OTA is assumed to be formed like the differential circuit of FIG. 3. Such an OTA produces an output signal which is representative of a difference between two of the variable currents. The output signal is inversely proportional to a normalized differential input voltage (Vi/$\sqrt{(I0/\beta)}$) between −1 and +1 of the normalized differential input voltage as shown in FIG. 9.

Figure 10:
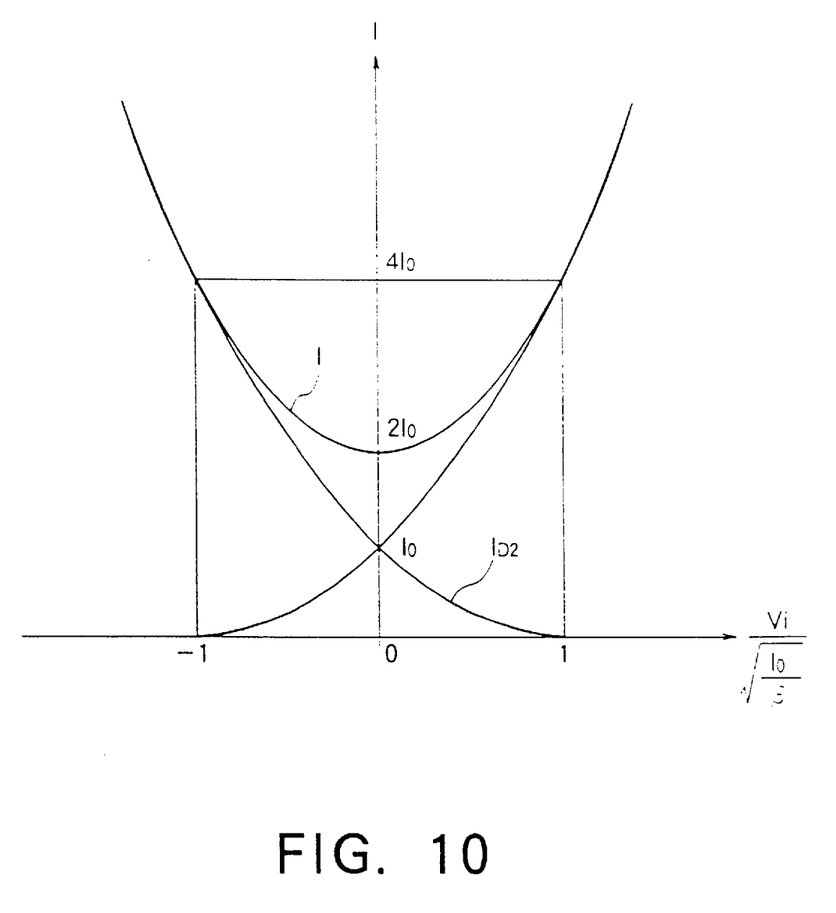
FIG. 10 shows input output characteristics of another differential circuit having a pair of the differential circuit illustrated in FIG. 7.

On the other hand, let the squaring circuit be formed in a manner similar to that of FIG. 5. The squaring circuit may produce an output signal which is representative of a sum of two of the variable currents. The output signal is varied along a parabolic curve when the normalized differential input voltage is varied, as shown in FIG. 10.

What is claimed is:

1. A differential circuit supplied with a differential input voltage to produce an output signal in response to said differential input voltage, said differential circuit comprising:

first and second bipolar transistors having first and second bases, first and second collectors, and first and second emitters connected to each other, respectively, said first and said second bases being supplied with said differential input voltage;

third and fourth bipolar transistors having third and fourth bases, third and fourth collectors, and third and fourth emitters connected to each other, respectively, said third and said fourth bases being supplied with said differential input voltage, said first through fourth bipolar transistors being matched with each other in characteristic;

a first constant current circuit connected to said first emitter for causing a first constant current to flow from said first collector to said first emitter;

a second constant current circuit connected to said fourth emitter for causing a second constant current which is equal to said first constant current to flow from said fourth collector to said fourth emitter;

a first variable current circuit providing a first variable current which varies as a function of said differential input voltage, said first variable current circuit being connected to said second emitter and connected to said second collector and causing said first variable current to flow from said second collector to said second emitter in response to said differential input voltage;

a second variable current circuit providing a second variable current which varies as a function of said differential input voltage, said second variable current circuit being connected to said third emitter and connected to said third collector and causing said second variable current to flow from said third collector to said third emitter in response to said differential input voltage; and summing means connected to both said second collector and said third collector for summing said first variable current and said second variable current to produce said output signal which is representative of the sum.

2. A differential circuit as claimed in claim 1, wherein said output signal is varied along a predetermined curve when said input voltage is varied.

3. A differential circuit as claimed in claim 2, wherein said predetermined curve is a hyperbolic cosine curve.

4. The differential circuit as claimed in claim 1, wherein said first variable current circuit comprises first and second current mirror circuits connected to form a current bootstrapping loop and said second variable current circuit comprises third and fourth current mirror circuits connected to form a current bootstrapping loop.

5. A differential circuit supplied with a differential input voltage to produce an output signal in response to said differential input voltage, said differential circuit comprising:

first and second MOSFETs having first and second gates, first and second drains, and first and second sources connected to each other, respectively, said first and said second gates being supplied with said differential input voltage;

third and fourth MOSFETs having third and fourth gates, third and fourth drains, and third and fourth sources connected to each other, respectively, said third and said fourth gates being supplied with said differential input voltage, said first through fourth MOSFETs being matched with each other in characteristic;

a first constant current circuit connected to said first source for causing a first constant current to flow from said first drain to said first source;

a second constant current circuit connected to said fourth source for causing a second constant current which is equal to said first constant current to flow from said fourth drain to said fourth source;

a first variable current circuit providing a first variable current which varies as a function of said differential input voltage said first variable current circuit being connected to said second source and to said second drain and causing said first variable current to flow from said second drain to said second source in response to said differential input voltage;

a second variable current circuit providing a second variable current which varies as a function of said differential input voltage, said second variable current circuit being connected to said third source and to said third drain and causing said second variable current to flow from said third drain to said third source in response to said differential input voltage; and summing means connected to both said second drain and said third drain for summing said first variable current and said second variable current to produce said output signal which is representative of the sum.

6. A differential circuit as claimed in claim 5, wherein said output signal is varied along a predetermined curve when said input voltage is varied.

7. A differential circuit as claimed in claim 6, wherein said predetermined curve is a parabolic circuit.

8. A differential circuit as claimed in claim 5, wherein said differential circuit is a squaring circuit.

9. The differential circuit as claimed in claim 5, wherein said first variable current circuit comprises first and second current mirror circuits connected to form a current bootstrapping loop and said second variable current circuit comprises third and fourth current mirror circuits connected to form a current bootstrapping loop.

10. A differential circuit supplied with a differential input voltage Vi to produce an output signal Vo in response to said differential input voltage, said differential circuit comprising:

first and second bipolar transistors having first and second bases, first and second collectors, and first and second emitters connected to each other, respectively, said first and said second bases being supplied with said differential input voltage;

third and fourth bipolar transistors having third and fourth bases, third and fourth collectors, and third and fourth emitters connected to each other, respectively, said third and said fourth bases being supplied with said differential input voltage, said first through fourth bipolar transistors being matched with each other in characteristic;

a first constant current circuit connected to said first emitter for causing a first constant current $CC_1$ to flow from said first collector to said first emitter;

a second constant current circuit connected to said fourth emitter for causing a second constant current $CC_2$ which is equal to said first constant current to flow from said fourth collector to said fourth emitter;

a first variable current circuit providing a first variable current $VC_1$ which varies as a function of said differential input voltage, said first variable current circuit being connected to said second emitter and connected to said second collector and causing said first variable current $VC_1$ to flow from said second collector to said second emitter in response to said differential input voltage;

a second variable current circuit providing a second variable current $VC_2$ which varies as a function of said differential input voltage, said second variable current circuit being connected to said third emitter and connected to said third collector and causing said second variable current $VC_2$ to flow from said third collector to said third emitter in response to said differential input voltage; and summing means connected to both said second collector and said third collector for summing said first variable current and said second variable current to produce said output signal which is representative of the sum, wherein said first and second variable currents are given by:

$$VC_1=(CC_1)\times\exp(-Vi/VT)$$

$$VC_2=(CC_2)\times\exp(-Vi/VT)$$

where VT is a thermal voltage given by kT/q, where k is Boltzmann's constant, T is absolute temperature, and q is the charge of an electron.

11. The differential circuit as claimed in claim 10, wherein said first variable current circuit comprises first and second current mirror circuits connected to form a current bootstrapping loop and said second variable current circuit comprises third and fourth current mirror circuits connected to form a current bootstrapping loop.

* * * * *

UNITED STATES PATENT AND TRADEMARK OFFICE
CERTIFICATE OF CORRECTION

PATENT NO. : 5,872,483
DATED : February 16, 1999
INVENTOR(S) : Katsuji KIMURA

It is certified that error appears in the above-identified patent and that said Letters Patent is hereby corrected as shown below:

Column 5, line 44, before "is", insert --(comprising two current mirror circuits 35 and 36)--.

Column 5, line 50, before "is", insert --(comprising two current mirror circuits 37 and 38)--.

Column 7, line 41, after "circuits", insert --73 and 74--.

Signed and Sealed this

Eleventh Day of April, 2000

Attest:

Q. TODD DICKINSON

Attesting Officer

Director of Patents and Trademarks